(12) United States Patent
Dahan et al.

(10) Patent No.: US 11,982,623 B2
(45) Date of Patent: May 14, 2024

(54) ANALYSIS OF DEFECTS OF AT LEAST ONE TYPE FROM AMONG A PLURALITY OF TYPES OF DEFECTS BETWEEN AT LEAST TWO SAMPLES

(71) Applicant: COMMISSARIAT À L'ÉNERGIE ATOMIQUE ET AUX ÉNERGIES ALTERNATIVES, Paris (FR)

(72) Inventors: Patrick-Jeremy Dahan, Grenoble (FR); Renaud Varache, Grenoble (FR); Wilfried Favre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 689 days.

(21) Appl. No.: 17/264,628

(22) PCT Filed: Jul. 30, 2019

(86) PCT No.: PCT/EP2019/070522
§ 371 (c)(1),
(2) Date: Jan. 29, 2021

(87) PCT Pub. No.: WO2020/025625
PCT Pub. Date: Feb. 6, 2020

(65) Prior Publication Data
US 2021/0310955 A1    Oct. 7, 2021

(30) Foreign Application Priority Data

Jul. 31, 2018 (FR) ........................... 1857140

(51) Int. Cl.
*G01N 21/64* (2006.01)
*G01N 21/95* (2006.01)
(Continued)

(52) U.S. Cl.
CPC ..... *G01N 21/6489* (2013.01); *G01N 21/6456* (2013.01); *G01N 21/9501* (2013.01);
(Continued)

(58) Field of Classification Search
CPC ........... G01N 21/6489; G01N 21/6456; G01N 21/9501; G01N 21/95607; G06T 7/001;
(Continued)

(56) References Cited

U.S. PATENT DOCUMENTS

2005/0100206 A1* 5/2005 Imi ........................ G06T 7/001
382/145
2016/0313256 A1 10/2016 Sullivan et al.
(Continued)

FOREIGN PATENT DOCUMENTS

WO    WO 2016/0313256 A2    6/2015

OTHER PUBLICATIONS

International Search Report as issued in International Patent Application No. PCT/EP2019/070522, dated Sep. 5, 2019.
(Continued)

*Primary Examiner* — Michael P LaPage
(74) *Attorney, Agent, or Firm* — Pillsbury Winthrop Shaw Pittman LLP (57) ABSTRACT

A method of analysis of defects of a type from among a plurality of types of defects between two samples based on an image of each sample characteristic of a type of defect from among the plurality of types of defects includes: for each sample, creating a minimap including bins and representative of a type of defect whose resolution is less than the image of the sample, each bin of the minimap being associated with pixels of the image of the sample and having a score dependent on the pixels and representative of the quantity of a type of defects; determining the distance between each minimap representing the same type or types
(Continued)

of defects, the distance between two minimaps being defined as the minimum distance between two minimaps by considering the following transformations: a rotation and/or a symmetry so that each distance between two minimaps is associated with a transformation.

12 Claims, 6 Drawing Sheets

(51) Int. Cl.
      *G01N 21/956*     (2006.01)
      *G06T 7/00*     (2017.01)
      *H01L 21/66*     (2006.01)

(52) U.S. Cl.
      CPC ....... *G01N 21/95607* (2013.01); *G06T 7/001* (2013.01); *G06T 2207/20021* (2013.01); *G06T 2207/20212* (2013.01); *G06T 2207/30148* (2013.01); *H01L 22/12* (2013.01)

(58) Field of Classification Search
      CPC . G06T 2207/20021; G06T 2207/20212; G06T 2207/30148; G06T 7/337; H01L 22/12
      See application file for complete search history.

(56) References Cited

U.S. PATENT DOCUMENTS

| | | |
|---|---|---|
| 2016/0322934 A1 | 11/2016 | Nos Aguila et al. |
| 2020/0096454 A1* | 3/2020 | Konishi ................ G01N 21/88 |
| 2021/0041501 A1* | 2/2021 | Gurov .................... H01L 22/12 |

OTHER PUBLICATIONS

Nos, O., et al., "Quality control method based on photoluminescence imaging for the performance prediction of c-Si/a-Si:H heterojunction solar cells in industrial production lines," Solar Energy Materials & Solar Cells, vol. 144, (2016), XP029304977, pp. 210-220.
Brown, L. G., "A Survey of Image Registration Techniques," ACM Computing Surveys, vol. 24, No. 4, Dec. 1992, XP058191421, pp. 325-376.

* cited by examiner

|   |   |   |   |   |   |   |
|---|---|---|---|---|---|---|
| 6 | 5 | 5 | 6 | 4 | 10 | 10 | 1 |
| 10 | 8 | 6 | 7 | 8 | 15 | 10 | 10 |
| 8 | 7 | 8 | 6 | 6 | 6 | 6 | 2 |
| 2 | 8 | 9 | 8 | 4 | 4 | 6 | 13 |
| 1 | 0 | 3 | 2 | 0 | 2 | 10 | 10 |
| 10 | 0 | 0 | 1 | 0 | 0 | 0 | 2 |
| 0 | 100 | 0 | 0 | 1 | 0 | 30 | 70 |
| 1 | 1 | 0 | 0 | 0 | 0 | 0 | 0 |

|   |   |   |   |   |   |   |   |
|---|---|---|---|---|---|---|---|
| 6 | 5 | 5 | 6 | 4 | 10 | 10 | 1 |
| 10 | 8 | 6 | 7 | 8 | 15 | 10 | 10 |
| 8 | 7 | 8 | 6 | 6 | 6 | 6 | 2 |
| 2 | 8 | 9 | 8 | 4 | 4 | 6 | 13 |
| 1 | 0 | 3 | 2 | 0 | 2 | 10 | 10 |
| 10 | 0 | 0 | 1 | 0 | 0 | 0 | 2 |
| 0 | 100 | 0 | 0 | 1 | 0 | 30 | 70 |
| 1 | 1 | 0 | 0 | 0 | 0 | 0 | 0 |

|  |  |  |  |
|---|---|---|---|
| 4/5 | 4/6 | 4/6 | 4/5 |
| 1/5  1/6 | 1/6  1/6 | 1/6  1/6 | 1/5 |
| 1/6  1/8 | 1/8  1/8 | 1/8  1/6 | |
| 4/6 ---- 1/2 | ---- 1/2 | ---- 4/6 | |
| 1/6  1/8 | 1/8  1/8 | 1/8  1/6 | |
| 1/6  1/8 | 1/8  1/8 | 1/8  1/6 | |
| 4/6 ---- 1/2 | ---- 1/2 | ---- 4/6 | |
| 1/6  1/8 | 1/8  1/8 | 1/8  1/6 | |
| 1/5  1/6 | 1/6  1/6 | 1/6  1/5 | |
| 4/5 | 4/6 | 4/6 | 4/5 |

ANALYSIS OF DEFECTS OF AT LEAST ONE TYPE FROM AMONG A PLURALITY OF TYPES OF DEFECTS BETWEEN AT LEAST TWO SAMPLES

CROSS-REFERENCE TO RELATED APPLICATIONS

This application is the U.S. National Stage of PCT/EP2019/070522, filed Jul. 30, 2019, which in turn claims priority to French patent application number 1857140 filed Jul. 31, 2018. The content of these applications are incorporated herein by reference in their entireties.

TECHNICAL FIELD OF THE INVENTION

The technical field of the invention is that of the analysis of defects in a constituent of a device, for example a photovoltaic cell. The present invention relates to a method of analysis of at least one type of defects from among a plurality of types of defects between at least two samples. The present invention also relates to a device that allows for the implementing of the method.

TECHNOLOGICAL BACKGROUND OF THE INVENTION

During the series production of parts or of devices, it is important to be able to analyse the defects of said parts or of said devices and to compare the position and the type of defects between different samples taken on the production line or measured during production. For example in the case of photovoltaic cells, many factors can influence the homogeneity of the cells at their surface: contaminants left by the manipulation of the semiconductor wafers, inhomogeneities in the methods of manufacturing, etc. For example, during the manufacture thereof, the photovoltaic cells are subjected to manipulations that can lead to a degradation of the surface of the cells causing a deterioration in performance. Such deteriorations can in particular be identified using photoluminescence or electroluminescence images.

Patent application WO2015/091895 presents a method wherein such a characterisation is proposed. For this, a first step consists of acquiring an photoluminescence image of a sample to be examined. This image then undergoes a step of cleaning during which the metal patterns are removed then a step of division. At the end of the step of the division, two images were created: a first image containing the low frequencies that correspond to the slow variations of the starting image and a second image containing the high frequencies (and corresponding to the defects that can be introduced during manufacturing). These two images are then used to produce a metric of the defects. This method therefore makes it possible to perform a monitoring of the defects during the manufacturing but however has disadvantages. The first of these disadvantages comes from the metrics obtained. Although the latter makes it possible to characterise the defect level of a sample, no spatial information on said defects is preserved during the image processing. It is therefore impossible using this method to extract information regarding the position of the defects. In addition, if it is desired to compare samples to each other, this comparison must be carried out using at least one of the two images. However the comparison between two images can be complicated due to the large number of pixels that they are composed of. In addition, such a comparison is done pixel-by-pixel which does not make it possible to take account of slight differences in the position of the defects from one sample to another. On the other hand, when the number of images to be compared is large, this comparison requires substantial computation power. Furthermore, all the samples are not manipulated identically which can lead to the presence of defects defined to the nearest rotation and/or symmetry.

There is therefore a need for a method that overcomes the disadvantages hereinabove. In particular there is a need for a method that allows for a comparison of the defects between several samples while still retaining spatial information on said defects and without this comparison being affected by the pseudo-random manipulations of said samples.

SUMMARY OF THE INVENTION

The invention provides a solution to the problems mentioned hereinabove, by making it possible to take account not only of the spatial aspect of the defects but also the different manipulations that the samples can be subjected to during the manufacture thereof.

A first aspect of the invention relates to a method of analysis of at least one type of defects from among a plurality of types of defects between at least two samples on the basis of an image of each sample characteristic of at least one type of defects from among said plurality of types of defects. The method according to a first aspect of the invention comprises:

for each sample, a step of creating at least one matrix, called a minimap, comprising a plurality of bins and representative of at least one type of defects from among the plurality of types of defects and the resolution of which is less than the image of the sample, each bin of the minimap being associated with a plurality of pixels of the image of the sample and having a score dependent on said pixels and representative of the quantity of at least one type of defects;

a step of determining the distance between each minimap representing the same type or types of defects from among the plurality of types of defects, the distance between two minimaps being defined as the minimum distance between two minimaps by considering the following transformations: a rotation and/or a symmetry, so that each distance between two minimaps is associated with a transformation.

In addition, the analysis of at least one type of defects from among the plurality of types of defects between at least two samples is carried out by taking account of the transformation associated with the distance between each minimap representative of the at least one type of defects from among the plurality of types of defects.

Thanks to the invention, it becomes possible to compare defects between several samples while still retaining spatial information on said defects and without this comparison being affected by the manipulations that pseudo-randomly affect the samples in question. In addition, the resolution of the minimaps being less than the resolution of the image, the analysis requires only a short calculation time. In what follows, the term "defects" means the defects of the sample that appear on the image. Therefore, the mention of defects or of type of defects refers not only to the defect or to the type of defects itself but to the manifestation thereof in the image. For example, in the case of an image by photoluminescence or electroluminescence, a defect can be defined as a zone of the image of which the intensity is less than a given percentage of the maximum intensity of the image, or the local maximum intensity of the image. This threshold percentage can for example be set to 20%, and the local maximum associated with a zone can for example be taken on a side square a tenth of the width of the image surrounding said zone.

In addition to the characteristics that have just been mentioned in the preceding paragraph, the method according to a first aspect of the invention can have one or more additional characteristics from among the following, taken individually or according to any technically permissible combinations.

In an embodiment, the step of creating a minimap comprises:
- a first sub-step of creating a grid, the grid having a resolution of N×N squares where N×N is the resolution of the minimap to be determined, the centre of the grid being aligned on the centre of the image and the grid entirely covering said image;
- a sub-step of calculating for each square of the grid a score dependent on the pixels of the image covered by said square, the score of each square of the grid being attributed to the bins of the corresponding minimap.

Alternatively, the step of creating a minimap comprises:
- a first sub-step of creating a first intermediate grid, the first intermediate grid having a resolution of N×N squares where N×N is the resolution of the minimap, the centre of the first intermediate grid being aligned on the centre of the image and the first intermediate grid entirely covering said image;
- a second sub-step of creating a second intermediate grid, the second intermediate grid having a resolution of (N−1)×(N−1) squares, the dimensions of the squares of the second intermediate grid being equal to the dimensions of the squares of the first intermediate grid, the centre of the second grid being aligned on the centre of the image;
- a third sub-step of calculating for each square of the first intermediate grid and of the second intermediate grid a score dependent on the pixels of the image covered by said squares;
- a fourth sub-step of calculating the score of each bin of the minimap, the score of a bin being equal to the weighted sum of the score of the square of the first intermediate grid associated with said bin and of the square or squares of the second intermediate grid covering the square of the first intermediate grid considered.

Thus, it is possible to take account of slight rotations of the defects between different samples. This method of creating is particularly adapted when the score is determined by a non-linear metric.

In an embodiment, the method according to a first aspect of the invention comprises a step of determining a maximum quantity of defects, said quantity being associated with a value of the score, referred to as the high reference value.

Thus, it is possible to build two visualisations: one absolute visualisation, wherein the values of the score greater than the high reference value are reduced to the high reference value (saturation), and a relative visualisation where the minimap is displayed with it minimum score reduced to zero and its maximum score to 100 (cent).

In an embodiment, the method according to a first aspect of the invention comprises, before the step of creating at least one minimap, for each sample, a step of applying a mask on the image of the sample, the step of creating at least one minimap being performed by taking account of the presence of the mask.

Thus, during the creation of the minimaps, it is possible to exclude certain parts of the image concerning a zone that does not correspond to the sample and/or to a zone of the sample that it is not desired to take into account, such as the edges of the sample.

In an embodiment, the method according to a first aspect of the invention comprises, before the step of creating at least one minimap, a step of filtering the image of the sample.

This step of filtering makes it possible to create a minimap that concerns only a part of the types of defects of the plurality of types of defects, even a single type of defects of the plurality of types of defects.

In an embodiment, the method according to a first aspect of the invention comprises a step of superimposing minimaps representing the same type or types of defects from among the plurality of types of defects, said superimposing being performed according to the distance that separates said minimaps and by taking account of the transformation associated with said distance so as to obtain at least one resulting minimap.

The term "resulting minimap" means a minimap obtained by the superimposing of at least two minimaps. Thus, it is permitted to compare the minimaps coming from different samples including when the samples in question have been subjected to different steps of manipulation.

In an embodiment, the method according to a first aspect of the invention comprises a step of superimposing images, said superimposing being performed according to the distance that separates the minimaps representing the same type or types of defects from among the plurality of types of defects and associated with each image, and by taking account of the transformation associated with said distance so as to obtain at least one resulting image.

The term "resulting image" means an image obtained by the superimposing of at least two images. Thus, it is permitted to compare the images coming from different samples including when the samples in question have been subjected to different steps of manipulation, and this thanks to the information provided by the minimaps and the distance that separates them.

A second aspect of the invention relates to a method for manufacturing photovoltaic cells comprising at least one step of analysing at least two samples on the basis of an image by photoluminescence or electroluminescence of each sample comprising at least one type of defects from among a plurality of types of defects using a method according to a first aspect of the invention.

A third aspect of the invention relates to a device comprising means for implementing a method according to a first aspect or a second aspect of the invention.

A fourth aspect of the invention relates to a computer program comprising instructions that, when the program is executed by a computer, lead the latter to implement the method according to a first aspect or a second aspect of the invention.

A fifth aspect of the invention relates to a data support that can be read by computer, on which the computer program is recorded according to a fourth aspect of the invention.

The invention and the various applications thereof will be understood better when reading the following description and when examining the accompanying figures.

BRIEF DESCRIPTION OF THE FIGURES

The figures are shown for the purposes of information and in no way limit the invention.

DETAILED DESCRIPTION OF AT LEAST ONE EMBODIMENT OF THE INVENTION

Unless mentioned otherwise, the same element that appears in different figures has a single reference.

Figure 1:
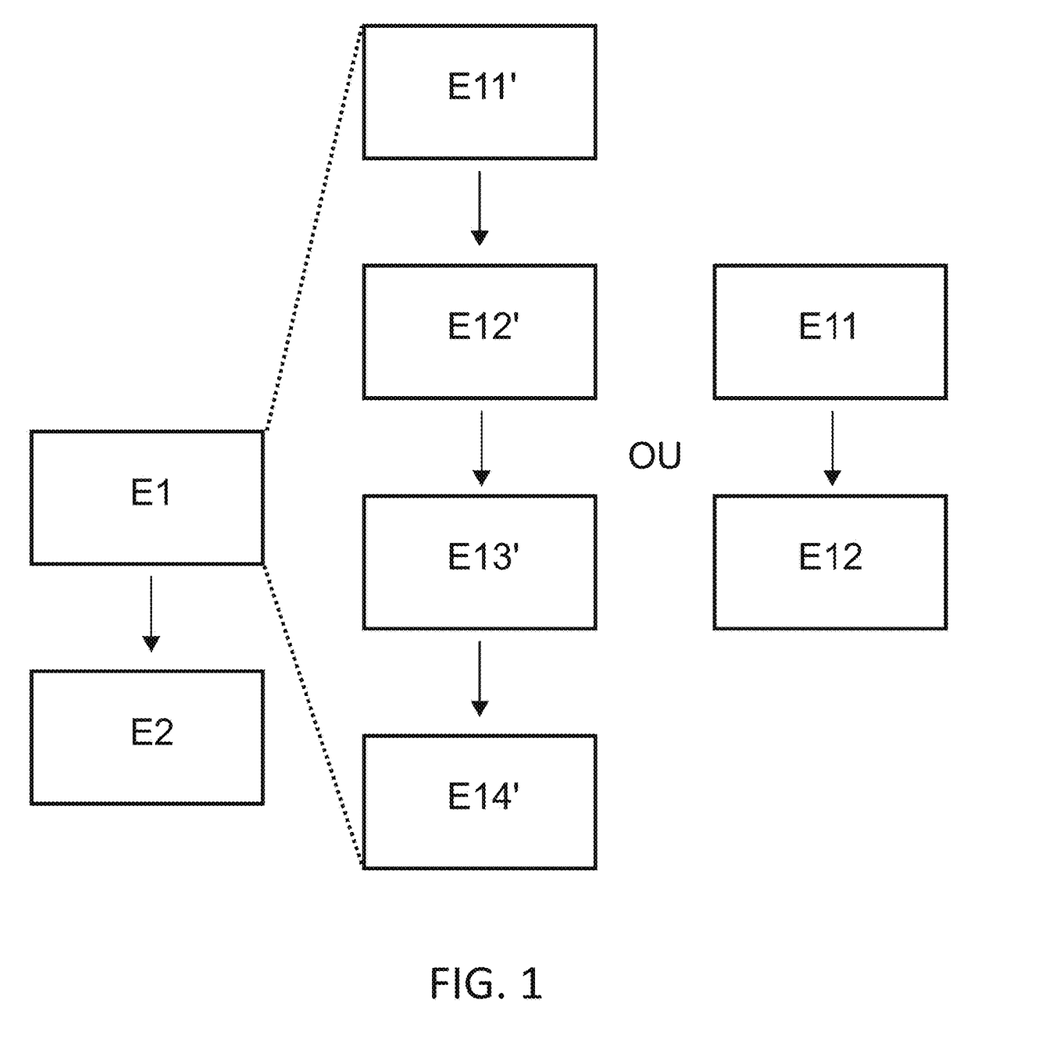
FIG. 1 shows a flowchart of a method according to a first aspect of the invention.
Figure 2A:
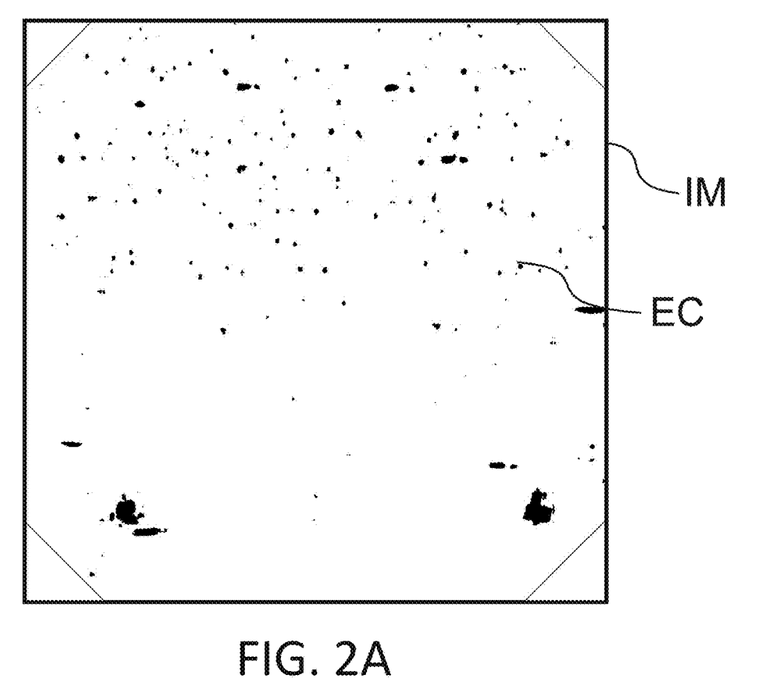
FIG. 2 diagrammatically shows the construction of a minimap in an embodiment of a method according to a first aspect of the invention.

An embodiment of a first aspect of the invention shown in FIG. 1 relates to a method of analysis of at least one type of defects from among a plurality of types of defects between at least two samples EC on the basis of an image IM of each sample EC characteristic of at least one type of defects from among said plurality of types of defects. Recall that "defects" means defects of the sample EC that appear on the image IM. Therefore, the mention of defects refers, not to the defect itself, but to the manifestation thereof in the image IM. For example, in the case of an image IM by photoluminescence or electroluminescence, a defect can be defined as a zone of the image IM of which the intensity is less than a given percentage of the maximum intensity of the image, or the local maximum intensity of the image. This threshold percentage can for example be set to 20%, and the local maximum associated with a zone can for example be taken on a side square a tenth of the width of the image surrounding said zone. Preferably, the geometry of the different samples EC is comparable. The term "comparable" means samples EC of which the diameter (or the width) is identical and of which the outer shape is similar (maximum deviations of less than 20% of the diameter or of the width). Preferably, the images IM of the different samples EC are taken in comparable conditions. Preferably, when the samples EC have different geometries, the image IM relates to the maximum zone that is common to all the samples EC. Generally, the differences in distance between the optical system and the sample EC, illumination, sensitivity of the image sensor, distortion of the optical path, can be corrected so as to reduce the images IM in an equivalent effective acquisition condition. The samples EC can be semiconductor wafers and the images IM can be images IM obtained by electroluminescence or photoluminescence. Such images IM can for example be acquired using a method such as described in patent application WO2015/091895 already mentioned. Thus, for each sample, an image IM is representative of a plurality of types of defects (for example, traces of contaminants, scratches, etc.). The analysis according to the invention can cover all or a portion of these types of defects. For example, in the case of semiconductor wafers interest can be given to all the defects or a focus on a given type of defects, for example to identify a problem of handling on a production line. Such an image IM is shown in FIG. 2A in the case of a photovoltaic cell imaged using a photoluminescence technique whereon the defects are visible in black. As shall be detailed in what follows, the selection of only a portion of the defects can be done by applying a filter on the image, said filter being dependent on the type or on the types of defects that are of interest.

Figure 2B:
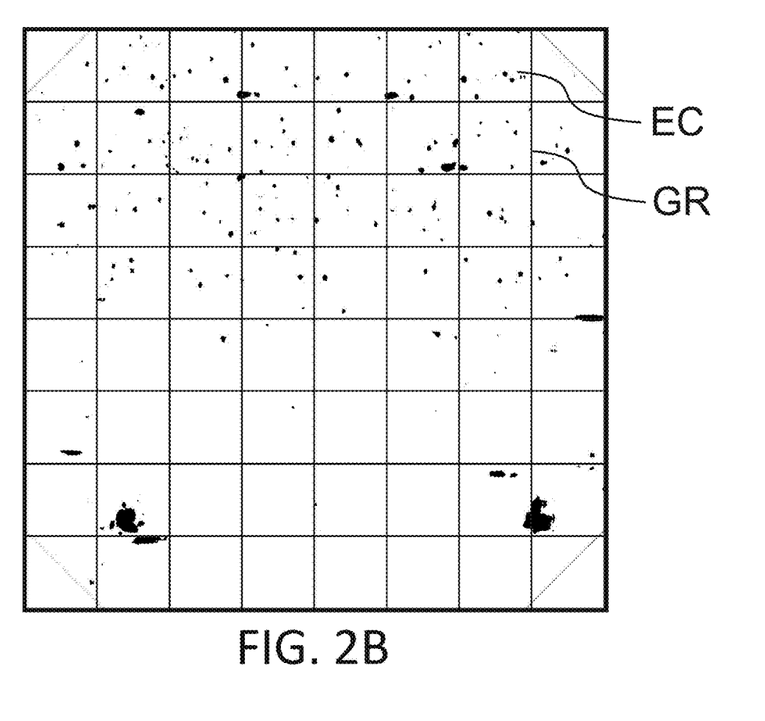
Figure 2C:
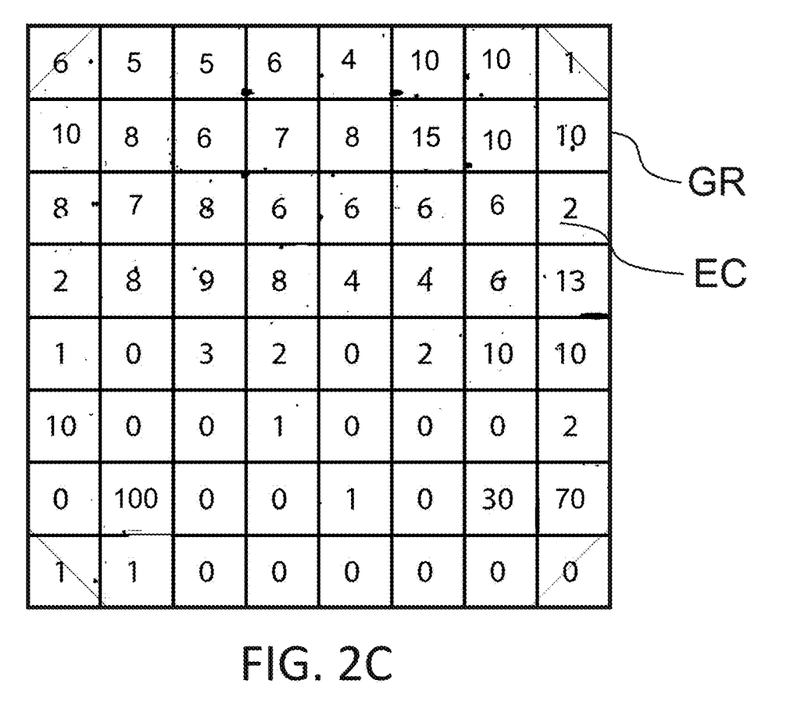
Figure 2D:
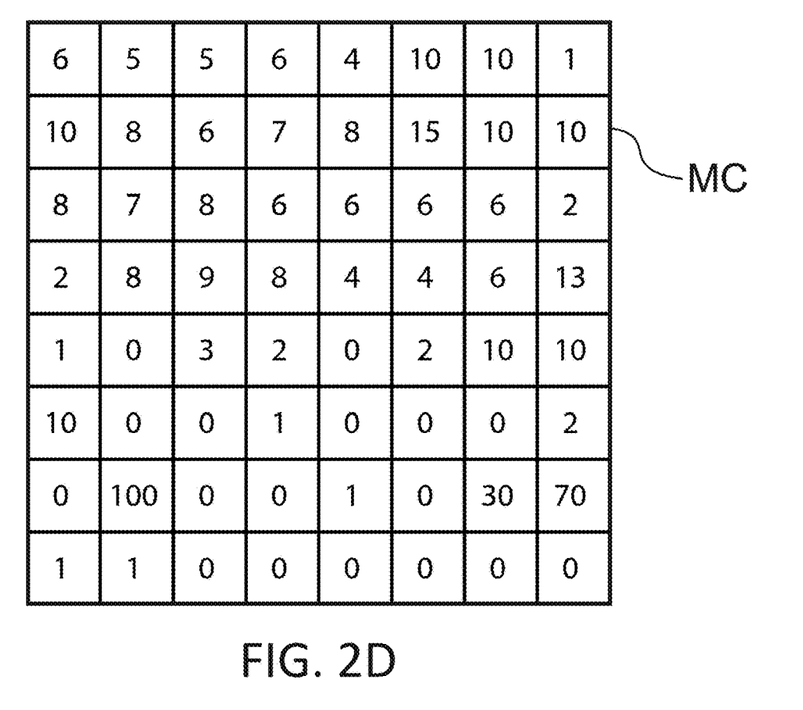

As shown in FIGS. 2B to 2D, the method according to a first aspect of the invention comprises, for each sample EC, a step E1 of creating at least one minimap MC comprising a plurality of bins and representative of at least one type of defects from among the plurality of types of defects, and the resolution of which is less than the image IM of the sample EC. In addition, each bin of the minimap MC is associated with a plurality of pixels of the image IM of the sample EC and has a score dependent on said pixels, said score being representative of the quantity of at least one type of defects.

Determining a minimap MC on the basis of an image IM can be done in several ways. In an embodiment, the determining of the minimap comprises a first sub-step E11 of creating a grid GR. This grid GR is comprised of squares and has a resolution of N×N squares where N×N is the resolution of the minimap MC that is desired to be determined. In other words, to each square of the grid GR is associated a bin of the minimap MC and to each bin of the minimap MC is associated a square of the grid GR (in other words there is a bijective relationship between the bins of the minimap MC and the squares of the grid GR). In addition, the centre of the grid GR is aligned on the centre of the image IM and the grid GR entirely covers said image IM. Thus, each pixel of the image IM is covered by a square and each square coves a plurality of pixels of the image IM. The method then comprises a second sub-step E12 of calculating for each square of the grid GR a score dependent on the pixels of the image IM covered by said square. For example, as already mentioned, if the image IM is a photoluminescence image IM, the score associated with a square can be given by the average value of the luminescence of the pixels contained in said square. Of course, so as to obtain the minimap MC, the score of each square of the grid GR is attributed to the bin of the corresponding minimap MC. In this embodiment, the grid GR is therefore identical to the minimap MC. This way of building the minimap MC has for advantage to be simple to implement. However, if a type of defects takes the form of a horizontal or vertical line on a first sample EC and the form of a slightly oblique line on a second sample EC, this way of proceeding can accentuate this slight difference when a portion of the oblique line passes from a first line (or column) of squares to a second line (or column) of squares in the grid GR.

Figure 3:
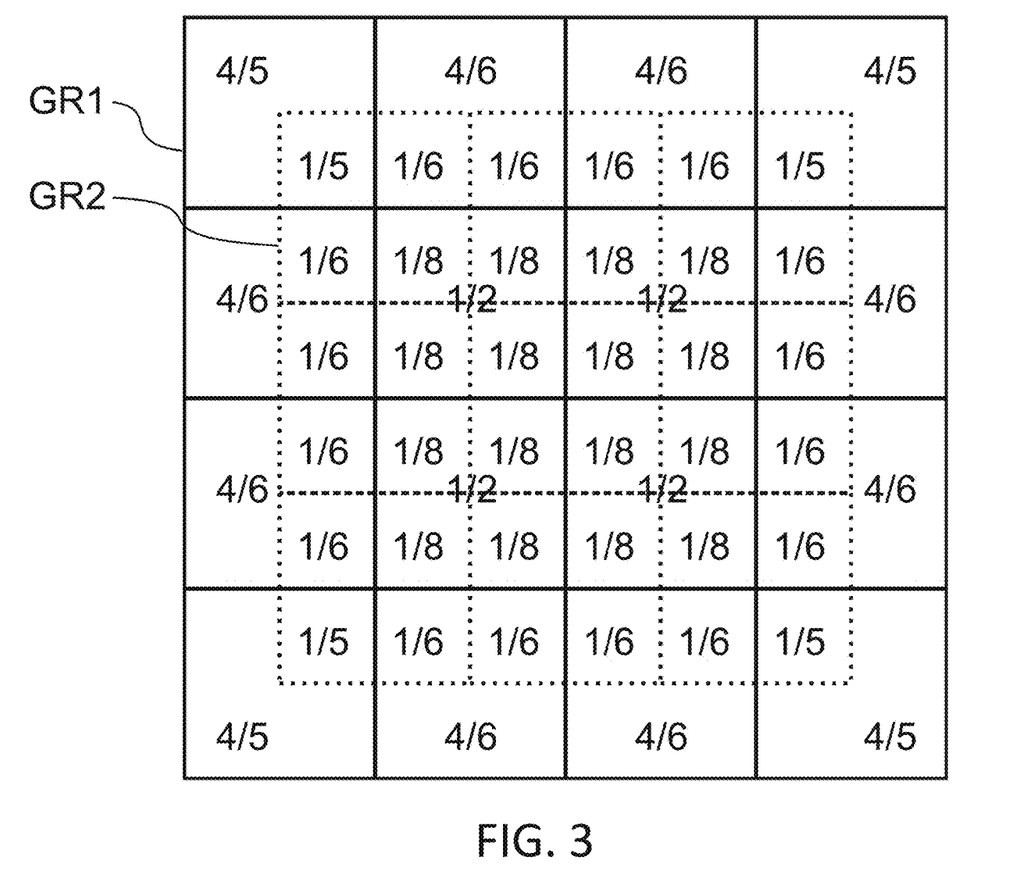
FIG. 3 diagrammatically shows two intermediate grids in an embodiment of a method according to a first aspect of the invention.

In order to limit this phenomenon, it is possible to use not one grid GR but two intermediate grids GR1, GR2. More particularly, in an embodiment shown in FIG. 3, the step of creating a minimap MC comprises a first sub-step E11' of creating a first intermediate grid GR1, the first intermediate grid GR1 (as a solid line in FIG. 3) having a resolution of N×N squares where N×N is the resolution of the minimap MC, the centre of the first intermediate grid GR1 being aligned on the centre of the image IM and the first intermediate grid GR1 entirely covers said image IM. Thus, each pixel of the image IM is covered by a square of the first intermediate grid GR1 and each square of the first intermediate grid GR1 coves a plurality of pixels of the image IM. As in the preceding case, to each square of the first intermediate grid GR1 is associated a bin of the minimap MC and to each bin of the minimap MC is associated a square of the first intermediate grid GR1 (in other words there is a bijective relationship between the bins of the minimap MC and the squares of the first intermediate grid GR1). The method then comprises a second sub-step E12' of creating a second intermediate grid GR2 (as a dotted line in FIG. 3) with a resolution of (N−1)×(N−1) squares, the dimensions of the squares of the second intermediate grid GR2 being equal to the dimensions of the squares of the first intermediate grid GR1, the centre of the second intermediate grid GR2 being aligned on the centre of the image IM (and therefore on the centre of the first intermediate grid GR1). Thus, each square of the second intermediate grid GR2 covers a plurality of pixels of the image IM, on the other hand all the pixels of the image IM are not covered by a square of the second intermediate grid GR2. By construction, each square of the second intermediate grid GR2 partially covers four squares of the first intermediate grid GR1. The method then comprises a step E13' of calculating for each square of the first intermediate grid GR1 and of the second intermediate grid GR2 a score dependent on the pixels of the image IM covered by said squares. For example, as already mentioned, if the image IM is a photoluminescence image, the score associated with a square will be given by the average value of the luminescence of the pixels contained in said square. Finally, the method comprises a step E14' of calculating the score of each bin of the minimap MC, the score of a bin being equal to the weighted sum of the score of the square of the first intermediate grid GR1 associated with said bin and of the square or squares of the second intermediate grid GR2 covering the square of the first intermediate grid GR1 considered. In other words, the score attributed to the bin of the minimap MC associated with a square of the first intermediate grid GR1 takes account of the score of this square but also the score or scores of the square or squares of the second intermediate grid GR2 that cover the square of the first intermediate grid GR1 considered. In an embodiment, this taking into account is done using the following weighted sum $S = \alpha(K)s_1 + \Sigma^{K}_{i=1} \beta(K)s^i_2$ where S is the score of the bin considered, K is the number of squares of the second intermediate grid GR2 covering the square of the first intermediate grid GR1 associated with the bin of the minimap MC of which the score is calculated, $\alpha$ is a weighting coefficient that depends on K, $s_1$ is the score of the square of the first intermediate grid GR1 associated with the bin of which the score is calculated, $\beta$ is weighting coefficient that depends on K and $s^i_2$ is the score of the $i^{th}$ square of the second intermediate grid GR2 covering the square of the first intermediate grid GR1 associated with the bin considered. In an embodiment shown in FIG. 3, the weighting coefficients are dependent on the surface of each square covering the bin of the minimap MC, i.e.

$$\alpha(K) = 4/(4+K) \text{ and } \beta(K) = \frac{1}{4+K}.$$

Generally, in the construction of a score attributing function, an initial calibration is required. The absolute minimum score is usually chosen as being equal to zero and corresponding to no defect, and the absolute maximum score is defined as the score of a region of the image IM judged as extremely defective, according to the type of defects considered. However, this experimental definition of the absolute maximum score leads to situations where this score is exceeded during the analysis of samples EC measured afterwards. In addition, this absolute maximum score cannot always be connected to the physical properties of the defects, which renders the verification thereof difficult (recall that the word "defect" refers to the manifestation of the latter in the image IM of the sample EC and therefore does not require knowing the physical origin of the defect). In order to overcome this difficulty, it is preferable that the score attributed to each bin of a minimap MC be a score without any absolute upper limit. The very high score of the region judged as very defective coming from the calibration image IM will however be used as the high reference value for the visualisations, for example set to 100. It is then possible to build two visualisations: one absolute visualisation, wherein the values of the score higher than the high reference value are reduced to the high reference value (saturation), and a relative visualisation where the minimap MC is displayed with its minimum score reduced to zero and its maximum score to 100. In other words, in an embodiment, the method according to a first aspect of the invention comprises a step of determining a maximum quantity of defects, said quantity being associated with a value of the score, referred to as the high reference value.

Figure 4A:
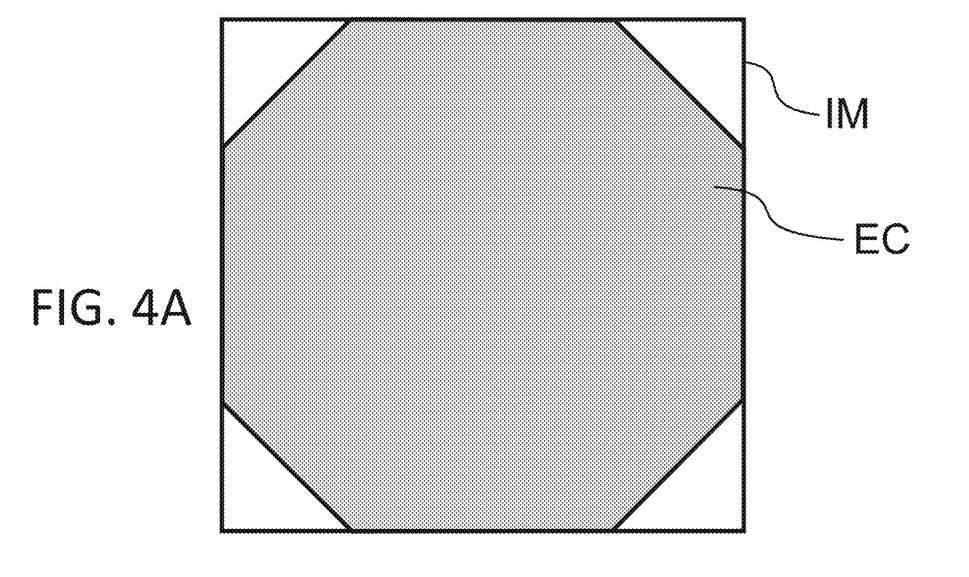
FIG. 4 diagrammatically shows the use of a mask in an embodiment of a method according to a first aspect of the invention
Figure 4B:
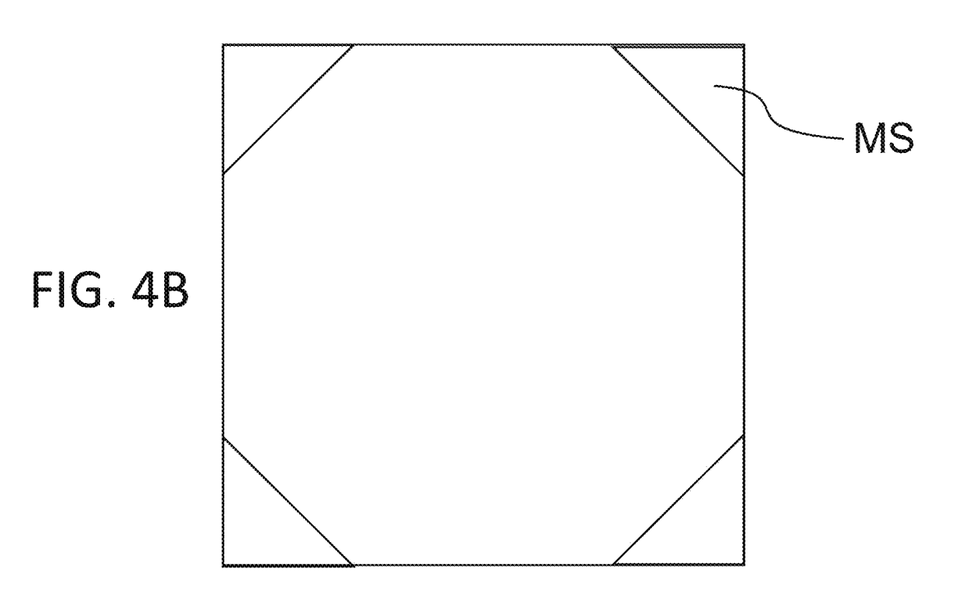
Figure 4C:
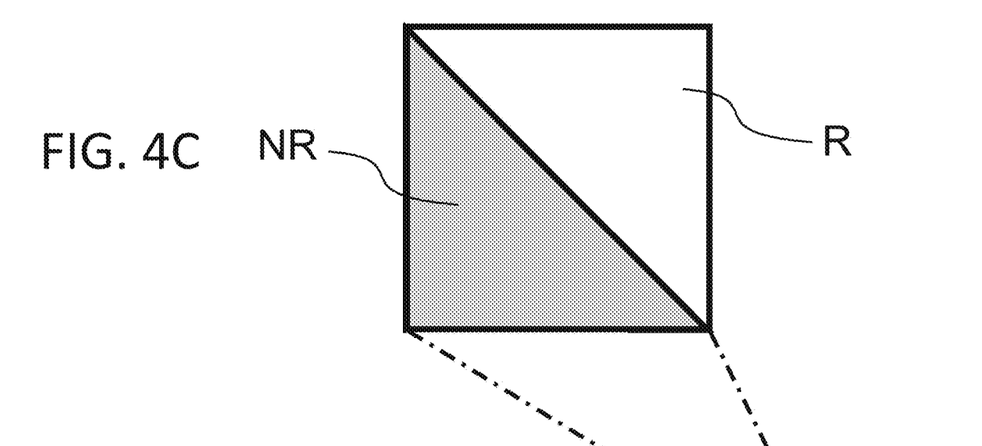
Figure 4D:
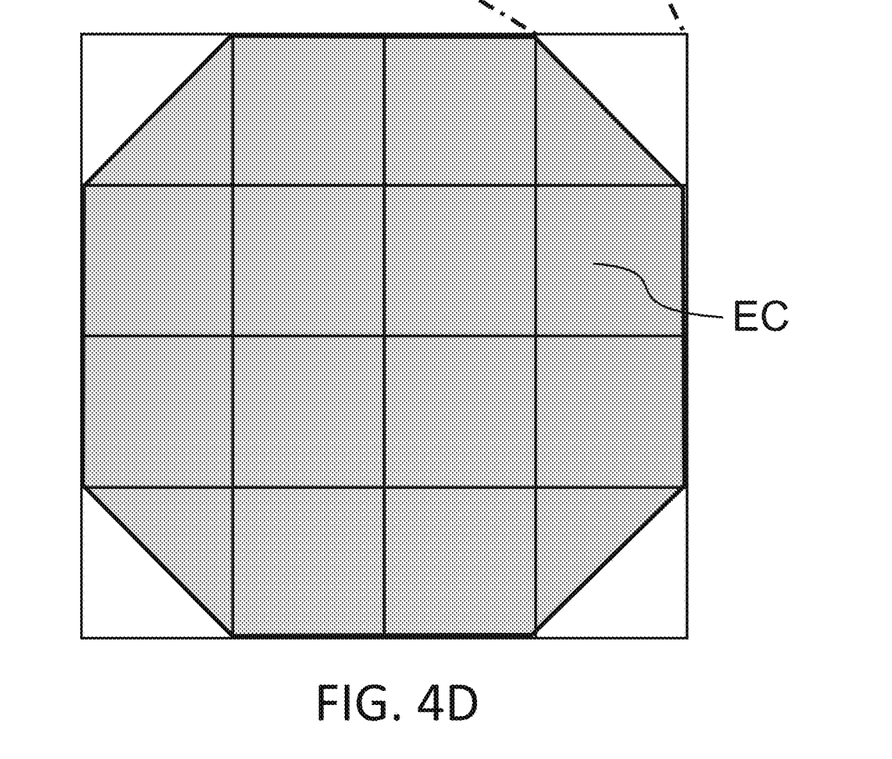

The image IM of a sample EC does not systematically adopt the format of the sample EC so that a portion of this image IM is not representative of the sample EC. This situation is for example shown in FIG. 4A where the pixels located in the angles of the image IM are not representative of the sample EC. Likewise, it can be advantageous to not take account of certain parts of the image IM, such as for example the edges of the sample EC which form particular zones. Also, in an embodiment, the method comprises, before the step E1 of creating at least one minimap MC, for each sample EC, a step E0 of applying a mask MS on the image IM of the sample EC. The mask MS corresponding to the sample EC of FIG. 4A is shown in FIG. 4B and comprises four zones that each correspond to an angle of the sample EC. Once said mask MS applied on the image IM of the sample EC, the step E1 of creating at least one minimap MC can be performed by taking account of the presence of the mask MS. In an embodiment, the score of a bin of a minimap MC is established dependent on the pixels of the image IM that it covers and which are not covered by the mask MS, the score thus obtained then being multiplied by the percentage of surface of the bin of the minimap MC not covered by the mask MS. For example, in FIG. 4C and FIG. 4D, the right upper bin is covered 50% by the mask MS, the zone covered by said mask MS corresponding to the zone that does not contain any pixel of the image IM concerning the sample EC. The score associated with this bin of the minimap MC will be calculated by taking account only of the pixels of the image IM in the zone not covered NR and the score thus obtained will then be divided by the percentage of the area of the bin of the minimap MC that the non-covered part NP represents: here 50%. For example, if the image IM is a photoluminescence image IM, the average luminescence will be calculated on the basis of pixels of the image IM corresponding to the part of the sample EC that is not covered NR (i.e. without taking account of the pixels of the image IM covered R by the mask MS) then the average value thus obtained will be multiplied by two (i.e. divided by 50%). It is understood that the mask MS thus described can also cover zones of the image IM concerning the sample EC that it is not desired to take into account for the determination of the minimap or minimaps MC.

In an embodiment, the resolution of a minimap MC is comprised between 3×3 and 48×48, preferably equal to 16×16. Of course, the resolution can be adapted to the size of the sample EC and to the resolution of the image IM used to produce the minimap MC. More generally, the resolution of the minimap MC is set by the defects themselves and more particularly by the size of the latter and by the possible translation of these defects between two samples EC. For example, the resolution of the minimap MC is chosen so that the size of a bin of the minimap MC is equal to the size of the defect of interest plus the possible translation of said defects from one sample EC to the other. For example, the average value of these two properties calculated over at least two samples, preferably a plurality of samples, is used to define the resolution of the minimap MC.

When it is desired to obtain a minimap MC representative of all the defects, the image representative of said types of defect can be used directly. On the other hand, if the image IM is characteristic of a plurality of defects and it is desired to obtain a minimap MC with interest given only to a single type of defects or only a part of the types of defects, it is useful to apply a filter on the image before performing the step E1 of creating at least one minimap MC. For this, in an embodiment, the method comprises, before the step E1 of creating at least one minimap MC, a step EU of filtering the image IM of the sample, said filter being adapted dependent on the type or types of defects that are of interest.

The first step E1 that has just been presented in detail makes it possible to be able to perform an analysis of the defects by retaining spatial information concerning said defects contrary to the method described in patent application WO2015/091895. This also makes it possible to compare different samples EC with each other, which is not possible with the image IM corresponding to said samples EC. Indeed, in the framework of an image IM, the pixel-by-pixel comparison would not provide any conclusive result due in particular to the position of a defect, even recurring from one sample EC to the other, can vary by several pixels according to the samples EC. It is interesting for what follows to note that a minimap MC can be viewed as an image IM wherein each bin is associated with a pixel of the image IM or as a matrix wherein each bin is associated with a matrix element, the dimension of the matrix dependent on the resolution of the minimap MC. In what follows, the matrix representation of a minimap MC of a sample i will be noted as $MC_i$.

The method according to a first aspect of the invention also comprises a step E2 of determining the distance between each minimap MC representing the same type or types of defects from among the plurality of types of defects. It is important to note that the distance between two minimaps MC makes sense only if the two minimaps MC were produced with the same score attributing functions. Also, as is specified, this step E2 of calculating the distance is performed only between minimaps MC representing the same type or types of defects from among the plurality of types of defects. As already disclosed, the position of the defects can vary from one sample EC to the other. In addition to a slight variation in translation, this variation can also correspond to a rotation or a symmetry due to for example one or more steps of manipulating the sample EC. In addition, these steps of manipulating can vary from one sample EC to the other on the production chain. In order to be able to perform an effective comparison between sample EC, it is therefore essential to also take account of this aspect. In the method according to the invention, this taking into account is done through the definition of the distance between two minimaps MC. More particularly, the distance between two minimaps MC is defined as the minimum distance between two minimaps MC by considering the following transformations: a rotation and/or a symmetry. Thus, each distance between two minimaps MC is associated with a transformation. The distance between two minimaps MC can for example be a Euclidean distance. In an embodiment, the transformations considered comprise a rotation of $n\pi/2$ with n an integer and/or a mirror transformation (in practice it is possible to choose $n \in [0,3]$). Thus, to measure the distance between two minimaps MC, the distance between the two minimaps MC is calculated by applying a transformation on one of the two minimaps MC, and this for each transformation listed hereinabove, then the shortest distance from among the distances thus determined is retained as being the distance that separates the two minimaps MC. It is therefore possible to associate with each distance a transformation that made it possible to obtain said distance.

Once the distances between minimaps are calculated, the analysis of at least one type of defects from among the plurality of types of defects between at least two samples EC is performed by taking account of the transformation associated with the distance between each minimap MC representative of the at least one type of defects from among the plurality of types of defects.

In certain cases, it can be advantageous to visually compare different samples EC with respect to all or a portion of the plurality of types of defects. Such a comparison can be done by means of the minimap or minimaps MC associated with each sample EC or by means of the image IM associated with each sample EC. In order to perform this comparison using a minimap MC, in an embodiment, the method according to a first aspect of the invention comprises a step of superimposing minimaps MC representing the same type or types of defects from among the plurality of types of defects, said superimposing being performed according to the distance that separates said minimaps MC and by taking account of the transformation associated with said distance, so as to obtain at least one resulting minimap MC. The term "resulting minimap MC" refers to a minimap MC obtained by the superimposing of at least two minimaps MC.

This superimposing can for example be obtained by a hierarchical grouping algorithm, for example by using a so-called Weighted Pair Group Method with Arithmetic Mean (or WPGMA). In this algorithm, a matrix $\Delta_0$ representing the distances separating the minimaps MC considered is constituted. For example, if we assume five minimaps MC each associated with a sample EC and representing the same type or types of defects from among the plurality of types of defects as the other minimaps MC, the distance separating said minimaps MC can be put into the following matrix form $\Delta_0$:

$$\Delta 0 = \begin{pmatrix} 0 & 5 & 12 & 23 & 19 \\ 5 & 0 & 42 & 22 & 12 \\ 12 & 42 & 0 & 9 & 43 \\ 23 & 22 & 9 & 0 & 22 \\ 19 & 15 & 43 & 22 & 0 \end{pmatrix}$$

The two closest minimaps MC (of which the distances are in bold in the matrix) are then superimposed, the superimposing thus obtained constitutes a resulting minimap MC that replaces the two minimaps MC thus superimposed. In the example hereinabove, the most reliable distance between two minimaps MC is 5 and the two corresponding minimaps MC are superimposed to give a resulting minimap MC. From a matric standpoint, superimposing a first minimap $MC_1$ on a second minimap $MC_2$ can be written in the form $$MC_{res} = \frac{1}{2}MC_1 + \frac{1}{2}MC_2$$

where $MC_{res}$ is a minimap MC resulting from this superimposing. The distances that separate this resulting minimap MC from the other minimaps MC is then calculated in such a way as to obtain a new matrix $\Delta_1$ of the distances (the distances that were recalculated are in bold and correspond to the distances that separate the resulting minimap MC that has just been obtained from the other minimaps MC):

$$\Delta 1 = \begin{pmatrix} 0 & 30 & 21 & 17 \\ 30 & 0 & 9 & 43 \\ 21 & 9 & 0 & 22 \\ 17 & 43 & 22 & 0 \end{pmatrix}$$

In an embodiment, the process is repeated until a single minimap MC is obtained. In an embodiment, the process is repeated until a predefined number of minimaps MC is obtained. In an embodiment, the process is repeated until the distance that separates the two closest minimaps MC is greater than a predetermined threshold. Of course, each superimposing is performed by taking account of the transformation associated with the distance that separates the two minimaps MC to be superimposed. In other words, if the distance between a first minimap MC and a second minimap MC is associated with a rotation of $$\frac{\pi}{2}$$

of the second minimap MC, then the second minimap MC will undergo a rotation of $$\frac{\pi}{2}$$

before being superimposed on the first minimap MC. In addition, to each resulting minimap MC obtained on the basis of the superimposing of two deux or more minimaps MC is associated a number corresponding to the number of minimaps MC that were superimposed in order to obtain said resulting minimap MC. Thus, an adapted coefficient can be used during the superimposing of a resulting minimap MC obtained by superimposing a plurality of other minimaps and a minimap MC not resulting from any superimposing. For example, if a first minimap $MC_{res1}$ obtained by the superimposing of three other minimaps MC is superimposed on a second minimap $MC_2$ that does not result from any superimposing, the weighting associated with the first minimap $MC_{res}$ will be and the weighting associated with the second minimap $MC_2$ will be and the new minimap $MC_{res2}$ obtained by said superimposing will be given by $$MC_{res2} = \frac{3}{4}MC_{res1} + \frac{1}{4}MC_2.$$

More generally the minimap $MC_{tot}$ obtained by the superimposing of a first minimap $MC_{part1}$ corresponding to the superimposing of i minimaps MC and of a second minimap $MC_{part1}$ corresponding to the superimposing of j minimaps MC is given by $$MC_{tot} = \frac{i}{i+j}MC_{part1} + \frac{j}{i+j}MC_{part2}.$$

In addition, the minimap $MC_{tot}$ will be associated with a number of superimposed minimaps MC equal to i+j. At the end of the method, one or several resulting minimaps MC are thus obtained, the latter allowing for a comparison of the different types of defects. When several resulting minimaps MC are obtained (in other words a "clustering" of samples EC has been performed), it is in particular possible to examine the distance that separates these different resulting minimaps MC. This distance can in particular make it possible to evaluate the heterogeneity between the different samples EC. More particularly, if the distance between a first minimap MC and a second minimap MC is large, then the heterogeneity is between the samples EC that made it possible to obtain the first minimap MC and the samples EC that made it possible to obtain the second minimap MC is also substantial. The creating of minimap MC therefore makes it possible to group the different samples EC together dependent on the homogeneity of the defects that affect them.

As has already been mentioned, it is also possible to perform a comparison of the defects between samples EC using the image IM associated with each one of these samples EC. For this, in an embodiment, the method according to a first aspect of the invention comprises a step of superimposing images IM associated with each sample, said superimposing being performed according to the distance that separates the minimaps MC associated with said images IM representing the same type or types of defects from among the plurality of types of defects and by taking account of the transformation associated with said distance, so as to obtain at least one resulting image IM. The term "resulting image IM" means an image obtained by the superimposing of at least two images IM. It is important to note that the superimposing between a first image IM and a second image IM is done on the basis of information relative to a first minimap MC associated with the first image and a second minimap MC associated with the second image IM, the first and second minimap MC being relative to the same type of defects or to the same types of defects. In addition, when two images IM are superimposed, it is necessary to take account of the number of superimposed images IM in order to obtain said images IM so as to apply the adapted weighting coefficients as has already been detailed in the case of minimaps MC. For this, as in the case of minimaps, any image obtained by the superimposing of other images is associated with a number representing the number of images IM that were required to obtain it. In other words, the image $IM_{tot}$ obtained by the superimposing of a first image $IM_{part1}$ corresponding to the superimposing of i images IM and of a second image $IM_{part2}$ corresponding to the superimposing of j images IM is given by $$IM_{tot} = \frac{i}{i+j}IM_{part1} + \frac{j}{i+j}IM_{part2}$$

(here an image is considered in its matrix form, each pixel of said image being associated with an element of the matrix). In addition, the minimap $IM_{tot}$ will be associated with a number of superimposed image IM equal to i+j. The notion of distance associated with a transformation confers upon the method according to the invention properties that a direct comparison of the images would not have (if the latter were technically possible). In particular, dependent on the type or types of defects represented on the minimaps MC, the superimposing of the images IM can vary. For example, two images IM can each correspond to a first minimap MC associated with a first type of defect and a second minimap MC associated with a second type of defect. In addition, the distance between the first minimap MC associated with the first image IM and the first minimap MC associated with the second image IM can be associated with a transformation identity while the distance between the second minimap MC associated with the first image IM and the second minimap MC associated with the second image IM can be associated with a rotation of $$\frac{\pi}{2}$$

of the second minimap MC associated with the second image IM. In this case, if the superimposing of the two images IM is performed dependent on the first minimaps MC, said superimposing will be done without any transformation. On the other hand, if the superimposing of the two images IM is performed dependent on second minimaps MC, said superimposing will be done after a rotation of $$\frac{\pi}{2}$$

A second aspect of the invention relates to a method of manufacturing photovoltaic cells comprising at least one step of analysis of at least one type of defects from among a plurality of types of defects between at least two samples EC on the basis of an image IM by photoluminescence or electroluminescence of each sample EC characteristic of at least one type of defects from among said plurality of types of defects using a method according to a first aspect of the invention. In an embodiment, the photovoltaic cells have a silicon base with homojunction or heterojunction. The samples EC can be as-cut wafers (i.e. before entering the production line), wafers sampled during production or the wafers once the method of manufacturing is terminated.

Note that a method according to a first or a second aspect of the invention can be implemented in a framework of searches, for example to understand the actual physical defects of the sample EC or of the samples EC. It can also be implemented in a framework of quality control of the samples EC, in the framework of the production strictly speaking or in the framework of a calibration during the start-up of a new method of manufacturing or a new manufacturing line (debugging).

In order to implement the two methods that details have just been provided for, a third aspect of the invention relates to a device comprising means for implementing a method according to a first aspect or a second aspect of the invention. In an embodiment, the device comprises a calculator (for example a processor, an FPGA or an ASIC card) associated with a memory. The memory can contain the instructions required to execute different steps of said method as well as the data needed for said execution, in particular the images IM as well as the minimaps MC obtained from said images IM. In an embodiment, the device also comprises means for acquiring images IM of samples to be analysed. In an embodiment, the acquisition means include a device for excitation, for example a laser, configured to excite a sample in such a way that the latter emits photons by luminescence as well as a device for acquiring a luminescence image IM, for example a camera.

The invention claimed is:

1. A method of analysis, using a computer, of at least one type of defects from among a plurality of types of defects between at least two samples of semiconductor devices manufactured on a production line on the basis of an image of each sample characteristic of at least one type of defects from among said plurality of types of defects comprising:

acquiring the image of each sample of the at least two samples of semiconductor devices;

for each sample, creating at least one matrix forming a minimap comprising a plurality of bins and representative of at least one type of defects from among the plurality of types of defects the resolution of which is less than the image of the sample, each bin of the minimap being associated with a plurality of pixels of the image of the sample and having a score dependent on said pixels and representative of the quantity of at least one type of defects;

determining the distance between each minimap representing the same type or types of defects from among the plurality of types of defects, the distance between two minimaps being defined as a minimum distance between two minimaps by considering the following transformations: a rotation and/or a symmetry so that each distance between two minimaps is associated with a transformation, an analysis of at least one type of defects from among the plurality of types of defects between at least two samples being performed by taking account of the transformation associated with the distance between each minimap representative of at least one type of defects from among the plurality of types of defects, and monitoring a production of the semiconductor devices on the production line based on the analysis of the at least one type of defects.

2. The method according to claim 1, wherein the creating of a minimap comprises:

a first sub-step of creating a grid, the grid having a resolution of N×N squares where N×N is the resolution of the minimap to be determined, the centre of the grid being aligned on the centre of the image and the grid entirely covering said image;

a sub-step of calculating for each square of the grid a score dependent on the pixels of the image covered by said square, the score of each square of the grid being attributed to the bins of the corresponding minimap.

3. The method according to claim 1, wherein the creating of a minimap comprises:

a first sub-step of creating a first intermediate grid, the first intermediate grid having a resolution of N×N squares where N×N is the resolution of the minimap, the centre of the first intermediate grid being aligned on the centre of the image and the first intermediate grid entirely covering said image;

a second sub-step of creating a second intermediate grid, the second intermediate grid having a resolution of x squares, the dimensions of the squares of the second intermediate grid being equal to the dimensions of the squares of the first intermediate grid, the centre of the second grid being aligned on the centre of the image;

a third sub-step of calculating for each square of the first intermediate grid and of the second intermediate grid a score dependent on the pixels of the image covered by said squares;

a fourth sub-step of calculating the score of each bin of the minimap, the score of a bin being equal to the weighted sum of the score of the square of the first intermediate grid associated with said bin and of the square or squares of the second intermediate grid covering the square of the first intermediate grid considered.

4. The method according to claim 1, further comprising determining a maximum quantity of defects, said quantity being associated with a value of the score, referred to as the high reference value.

5. The method according to claim 1, further comprising, before the creating of at least one minimap, for each sample, applying a mask on the image of the sample, the creating of at least one minimap being performed by taking account of the presence of the mask.

6. The method according to claim 1, further comprising, when the image of each sample is characteristic of a plurality of types of defects and before the creating of at least one minimap, filtering the image of the sample.

7. The method according to claim 1, further comprising superimposing minimaps representing the same type or types of defects from among the plurality of types of defects, said superimposing being performed according to the distance that separates said minimaps, and by taking account of the transformation associated with said distance, so as to obtain at least one resulting minimap.

8. The method according to claim 1, further comprising superimposing images, said superimposing being performed according to the distance that separates the minimaps representing the same type or types of defects from among the plurality of types of defects and associated with each image, and by taking account of the transformation associated with said distance, so as to obtain at least one resulting image.

9. A method of manufacturing photovoltaic cells comprising analysing at least two samples on the basis of an image by photoluminescence or electroluminescence of each sample comprising at least one type of defects from among a plurality of types of defects using a method according to claim 1.

10. A device comprising the computer including a calculator and a memory coded with instructions for implementing a method according to claim 1.

11. A non-transitory computer readable medium readable by a computer, comprising machine readable instructions for carrying out the method according to claim 1.

12. The method according to claim 1, further comprising displaying the minimap.

* * * * *

UNITED STATES PATENT AND TRADEMARK OFFICE
CERTIFICATE OF CORRECTION

| | | |
|---|---|---|
| PATENT NO. | : 11,982,623 B2 | Page 1 of 1 |
| APPLICATION NO. | : 17/264628 | |
| DATED | : May 14, 2024 | |
| INVENTOR(S) | : Patrick-Jeremy Dahan et al. | |

It is certified that error appears in the above-identified patent and that said Letters Patent is hereby corrected as shown below:

On the Title Page

Item (56) References Cited: FOREIGN PATENT DOCUMENTS:
Delete:
"WO    WO 2016/0313256 A2 06/2015"
Insert:
--WO    WO 2015/091895 A2 06/2015--

Signed and Sealed this
First Day of October, 2024

Katherine Kelly Vidal
*Director of the United States Patent and Trademark Office*